United States Patent
Ginsburg et al.

(10) Patent No.: US 8,476,687 B2
(45) Date of Patent: Jul. 2, 2013

(54) LOW IMPEDANCE TRANSMISSON LINE

(75) Inventors: Brian P. Ginsburg, Allen, TX (US);
Vijay B. Rentala, Plano, TX (US);
Srinath M. Ramaswamy, Murphy, TX (US); Baher S. Haroun, Allen, TX (US);
Eungyoung Seok, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 351 days.

(21) Appl. No.: 12/888,208

(22) Filed: Sep. 22, 2010

(65) Prior Publication Data

US 2012/0068238 A1    Mar. 22, 2012

(51) Int. Cl.
*H01L 27/108* (2006.01)
*H01L 29/76* (2006.01)
*H01L 29/94* (2006.01)
*H01L 31/119* (2006.01)

(52) U.S. Cl.
USPC .......... 257/296; 257/664; 257/E27.086

(58) Field of Classification Search
USPC .......... 257/259, 296, 307, 367, 662, 664, 257/E27.086
See application file for complete search history.

(56) References Cited

U.S. PATENT DOCUMENTS

| 5,639,686 A | 6/1997 | Hirano et al. |
| 2009/0141767 A1* | 6/2009 | Cummins ............ 374/142 |

FOREIGN PATENT DOCUMENTS

| JP | 2001-111408 A | 4/2001 |
| JP | 2005-027005 A | 1/2005 |
| JP | 2007-115737 A | 5/2007 |

OTHER PUBLICATIONS

PCT Search Report mailed May 3, 2012.

* cited by examiner

*Primary Examiner* — Hoai V Pham
(74) *Attorney, Agent, or Firm* — Alan A. R. Cooper; Wade J. Brady, III; Frederick J. Telecky, Jr.

(57) ABSTRACT

Transmission lines employing transmission line units or elements within integrated circuits (ICs) are well-known. Typically, different heights for these transmission line units can vary the characteristics of the cell (and transmission line), and there is typically a tradeoff between impedance and space (layout) specifications. Here, a transmission line is provided, which is generally comprised of elements of the same general width, but having differing or tapered heights that allow for impedance adjustments for high frequency applications (i.e., 160 GHz). For example, a transmission line that is coupled to a balun, with the transmission line units decreasing in height near the balun's center tap to adjust the impedance of the transmission line for the balun, is shown.

18 Claims, 14 Drawing Sheets

LOW IMPEDANCE TRANSMISSON LINE

TECHNICAL FIELD

The invention relates generally to transmission lines and, more particularly, to low impedance transmission lines for high frequency applications.

BACKGROUND

Transmission lines employing transmission line units or elements within integrated circuits (ICs) are well-known. Typically, different heights for these transmission line units can vary the characteristics of the cell (and transmission line). Namely, the impedance is inversely proportional to the height. However, there is typically a tradeoff between impedance and space (layout) specifications. Additionally, many components, such as balun, use different input impedances. Therefore, there is a desire for a transmission line with element that can be varied to accommodate different components while complying with spacing specifications.

SUMMARY

A preferred embodiment of the present invention, accordingly, provides an apparatus. The apparatus comprises a MOS capacitor formed on a substrate; a metal capacitor that is formed over the MOS capacitor; and a coplanar waveguide formed over the metal capacitor.

In accordance with a preferred embodiment of the present invention, the metal capacitor further comprises a metallization layer having first, second, and third portions that are interdigitated.

In accordance with a preferred embodiment of the present invention, the metallization layer further comprises a first metallization layer, and wherein the coplanar waveguide further comprises: a second metallization layer having first, second, and third portions; a first set of conductive vias formed between the first portion of the first metallization layer and the first portion of the second metallization layer; a second set of conductive vias formed between the second portion of the first metallization layer and the second portion of the second metallization layer; and a third set of conductive vias formed between the third portion of the first metallization layer and the third portion of the second metallization layer.

In accordance with a preferred embodiment of the present invention, the first metallization layer further comprises a plurality of first metallization layers that each have first, second, and third portions.

In accordance with a preferred embodiment of the present invention, the coplanar waveguide further comprises: a third metallization layer having a first, second, and third portions; and a fourth set of conductive vias formed between at least one of the first and third portions of the second metallization layer and the third metallization layer.

In accordance with a preferred embodiment of the present invention, MOS capacitor further comprises: a fourth metallization layer having a first portion and a second portion; a plurality of source/drain regions formed in the substrate; a plurality of gate insulator layers formed over the substrate, wherein each gate insulator layer is formed between at least two source/drain regions; a plurality of gate electrodes, wherein each gate electrode is formed over at least one of the gate insulator layers; a strap that is coupled to each gate electrode; a seventh set of conductive vias, wherein each conductive via from the seventh set is formed between at least one source/drain region and the first portion of the fourth metallization layer; and an eighth set of conductive vias, wherein each conductive via from the eighth set is formed between at the strap and the second portion of the fourth metallization layer.

In accordance with a preferred embodiment of the present invention, the apparatus further comprises a diode formed on the substrate.

In accordance with a preferred embodiment of the present invention, an apparatus is provided. The apparatus comprises a balun having a center tap; and a plurality of transmission line units that are adjacent to one another to form a transmission line, wherein the transmission line is coupled to the center tap, and wherein the transmission line units near the center tap are dimensioned to have a smaller height than the transmission line units away from center tap, wherein each transmission line unit includes: a MOS capacitor formed on a substrate; a metal capacitor that is formed over the MOS capacitor; and a coplanar waveguide formed over the metal capacitor.

In accordance with a preferred embodiment of the present invention, each transmission line unit is about 4 µm in width, and wherein each transmission line units that is located away from the center tap are about 9.5 µm or greater in height, and wherein each transmission line units that is located near the center tap are greater than about less than about 9.5 µm in height.

In accordance with a preferred embodiment of the present invention, the transmission line unit nearest to the center tap further comprises a diode formed on the substrate.

In accordance with a preferred embodiment of the present invention, In accordance with a preferred embodiment of the present invention, an apparatus is provided. The apparatus comprises a balun having a center tap; and a plurality of transmission line units that are adjacent to one another to form a transmission line, wherein the transmission line is coupled to the center tap, and wherein the transmission line units near the center tap are dimensioned to have a smaller height than the transmission line units away from center tap, wherein each transmission line unit includes: a MOS capacitor having: a plurality of source/drain regions formed in the substrate; a plurality of gate insulator layers formed over the substrate, wherein each gate insulator layer is formed between at least two source/drain regions; a plurality of gate electrodes, wherein each gate electrode is formed over at least one of the gate insulator layers; a strap that is coupled to each gate electrode; a first metallization layer having a first portion and a second portion; a first set of conductive vias, wherein each conductive via from the first set is formed between at least one source/drain region and the first portion of the first metallization layer; and a second set of conductive vias, wherein each conductive via from the second set is formed between at the strap and the second portion of the first metallization layer; a second metallization layer having a first portion and a second portion; a third set of conductive vias, wherein each conductive via from the third set is formed between the first portion of the first metallization layer and the first portion of the second metallization layer; a fourth set of conductive vias, wherein each conductive via from the fourth set is formed between at the second portion of the first metallization layer and the second portion of the second metallization layer; a metal capacitor having: a third metallization layer having first, second, and third portions that are interdigitated; a fifth set of conductive vias, wherein each conductive via from the fifth set is formed between the first portion of the second metallization layer and at least one of the first and third portions of the third metallization layer; and a sixth set of conductive vias, wherein each conductive via from the} sixth set is formed between at the second portion of the third metallization layer and the second portion of the second metallization layer; a fourth metallization layer having a first, second, and third portions that are interdigitated; a seventh set of conductive vias formed between the first portion of the fourth metallization layer and the first portion of the third metallization layer; an eighth set of conductive vias formed between the second portion of the fourth metallization layer and the second portion of the third metallization layer; a ninth set of conductive vias formed between the third portion of the fourth metallization layer and the third portion of the third metallization layer; a fifth metallization layer having a first, second, and third portions that are interdigitated; a tenth set of conductive vias formed between the first portion of the fourth metallization layer and the first portion of the fifth metallization layer; an eleventh set of conductive vias formed between the second portion of the fourth metallization layer and the second portion of the fifth metallization layer; and a twelfth set of conductive vias formed between the third portion of the fourth metallization layer and the third portion of the fifth metallization layer; and a coplanar waveguide having: a sixth metallization layer having a first, second, and third portions, wherein the second portion of the sixth metallization layer receives a first supply voltage; a thirteenth set of conductive vias formed between the first portion of the fifth metallization layer and the first portion of the sixth metallization layer; a fourteenth set of conductive vias formed between the second portion of the fifth metallization layer and the second portion of the sixth metallization layer; a fifteenth set of conductive vias formed between the third portion of the fifth metallization layer and the third portion of the sixth metallization layer; a seventh metallization layer that receives a second supply voltage; and a sixteenth set of conductive vias coupled between at least one of the first and third portions of the sixth metallization layer and the seventh metallization layer.

In accordance with a preferred embodiment of the present invention, the strap and the gate electrodes are formed of polysilicon.

In accordance with a preferred embodiment of the present invention, the first, second, third, fourth, fifth, sixth, and seventh metallization layers are formed of copper or aluminum.

In accordance with a preferred embodiment of the present invention, the second supply voltage is ground.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
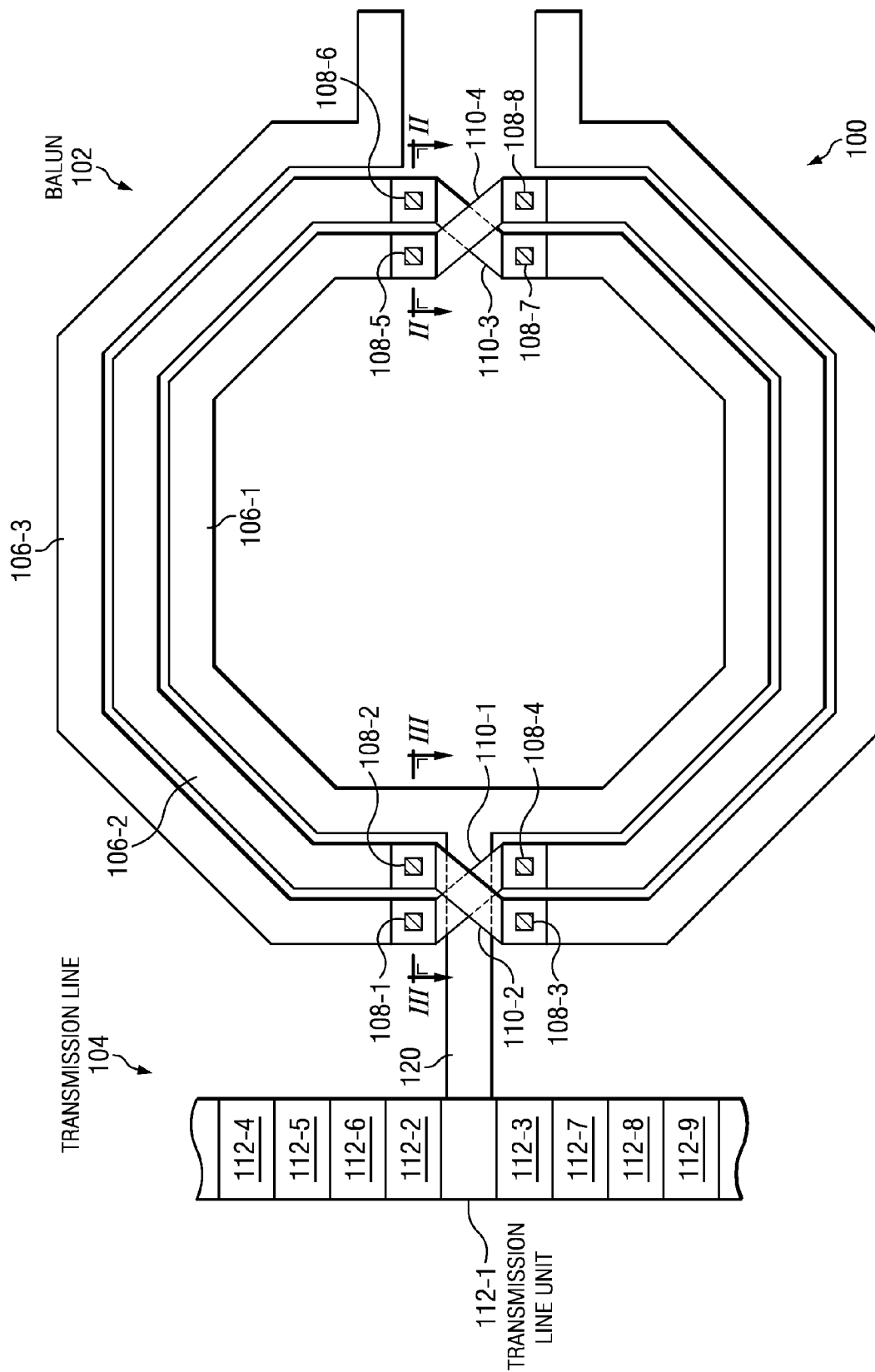
FIG. 1 is an example of system in accordance with a preferred embodiment of the present invention.

Refer now to the drawings wherein depicted elements are, for the sake of clarity, not necessarily shown to scale and wherein like or similar elements are designated by the same reference numeral through the several views.

Turning to FIG. 1 of the drawings, a system 100 in accordance with a preferred embodiment of the preset invention can be seen. System 100 generally comprises a transmission line 104 that is coupled to a balun 102 at its center tap 120. Typically, transmission line 104 carries signals in the frequency range of about 160 GHz (for example) and can have a length of about 20 μm. The balun 102 generally should be terminated in an impedance of about 1-2Ω at its center tap 120, but routing can produce about 10Ω (for a routing length of 20 μm at about 160 GHz). Thus, to adjust the impedance applied at the center tap 120, the transmission line units 112-1 to 112-9 of transmission line 104 are varied around the center tap 120. Typically, each transmission line unit 112-1 to 112-9 has a width of about 4 μm, with each transmission line away (i.e, 112-4 to 112-9) from the center tap 120 having a height of about 9.5 μm or greater.

Transmission line units near (i.e., 112-1 to 112-3) the center tap 120, however, cascade in decreasing height (shrinking from larger than 9.5 μm to a relative minimum height at the center of the center tap 120). This gradually scales the impedance in a controlled fashion. For example, the transmission line unit 112-4 (which is far from the center tap 120) can have a 12 μm height, while transmission line unit 112-2 (which is near the center tap 120) can have a height of 9 μm. These taller bias lines units (i.e., transmission line units 112-4 to 112-9) can decrease the series inductance, and, thus, can lower signal loss on the signal path (from transmission line 104 to balun 102). Each of these transmission line units 112-1 to 112-9 also generally comprises a MOS capacitor, a metal capacitor, and a coplanar waveguide.

Figure 2:
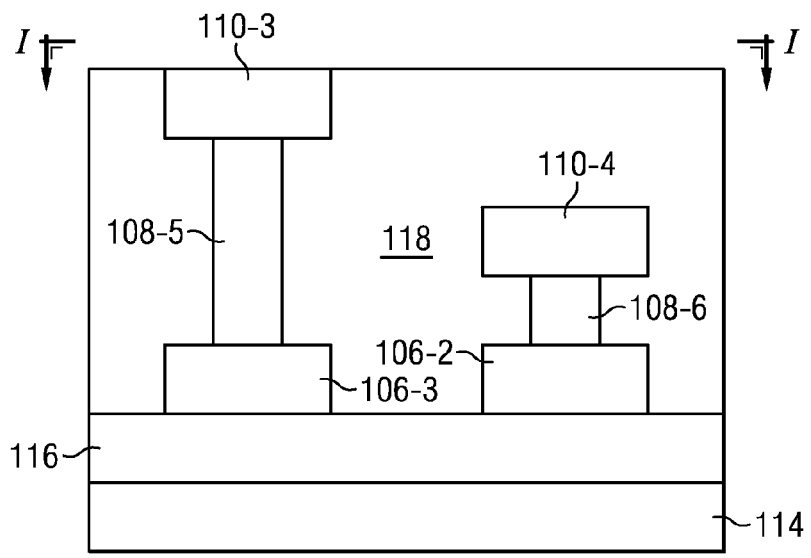
FIG. 2 is a cross-sectional view of the balun of FIG. 1 along section line A-A.
Figure 3:
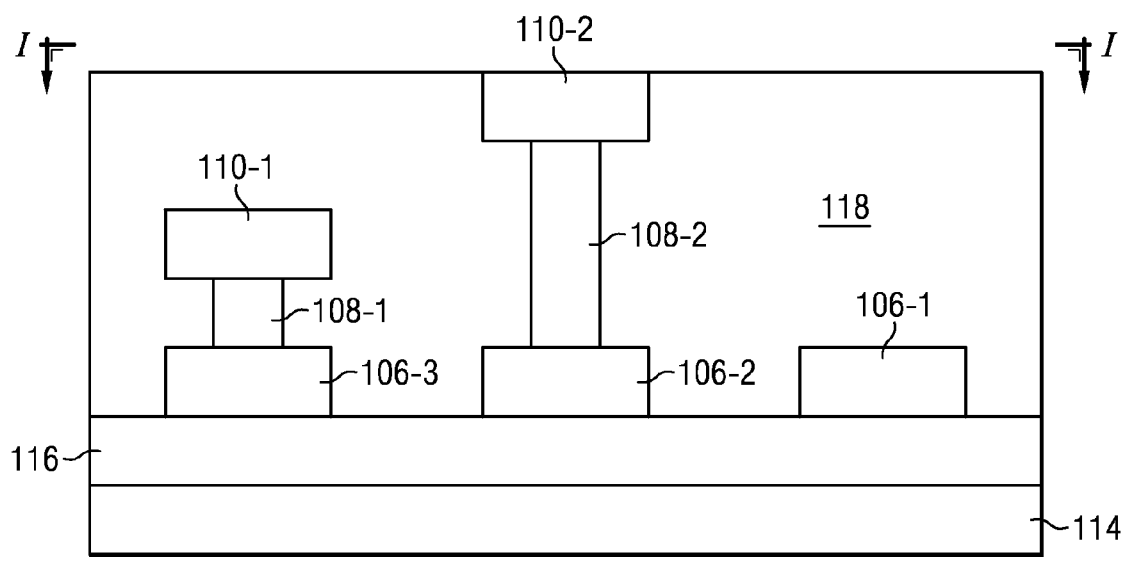
FIG. 3 is a cross-sectional view of the balun of FIG. 1 along section line B-B.

As shown in FIGS. 1-3, the balun 102 is generally comprises of three rings 106-1, 106-2, and 106-3 formed over a substrate 114 and that uses a dielectric layer 118 (which may be one or more layers). The inner ring 106-1 is coupled to the center tap 120 and is coupled to ring 106-2 through conductive vias 108-5 through 108-8 and coupling members 110-3 and 110-4. Ring 106-2, as shown, is then coupled to ring 106-3 through conductive vias 108-1 through 108-4 and coupling members 110-1 and 110-2. Additionally, balun 102 may be formed of layer 116 (which may include one or more layers and may include portions of transmission line 104).

Figure 4:
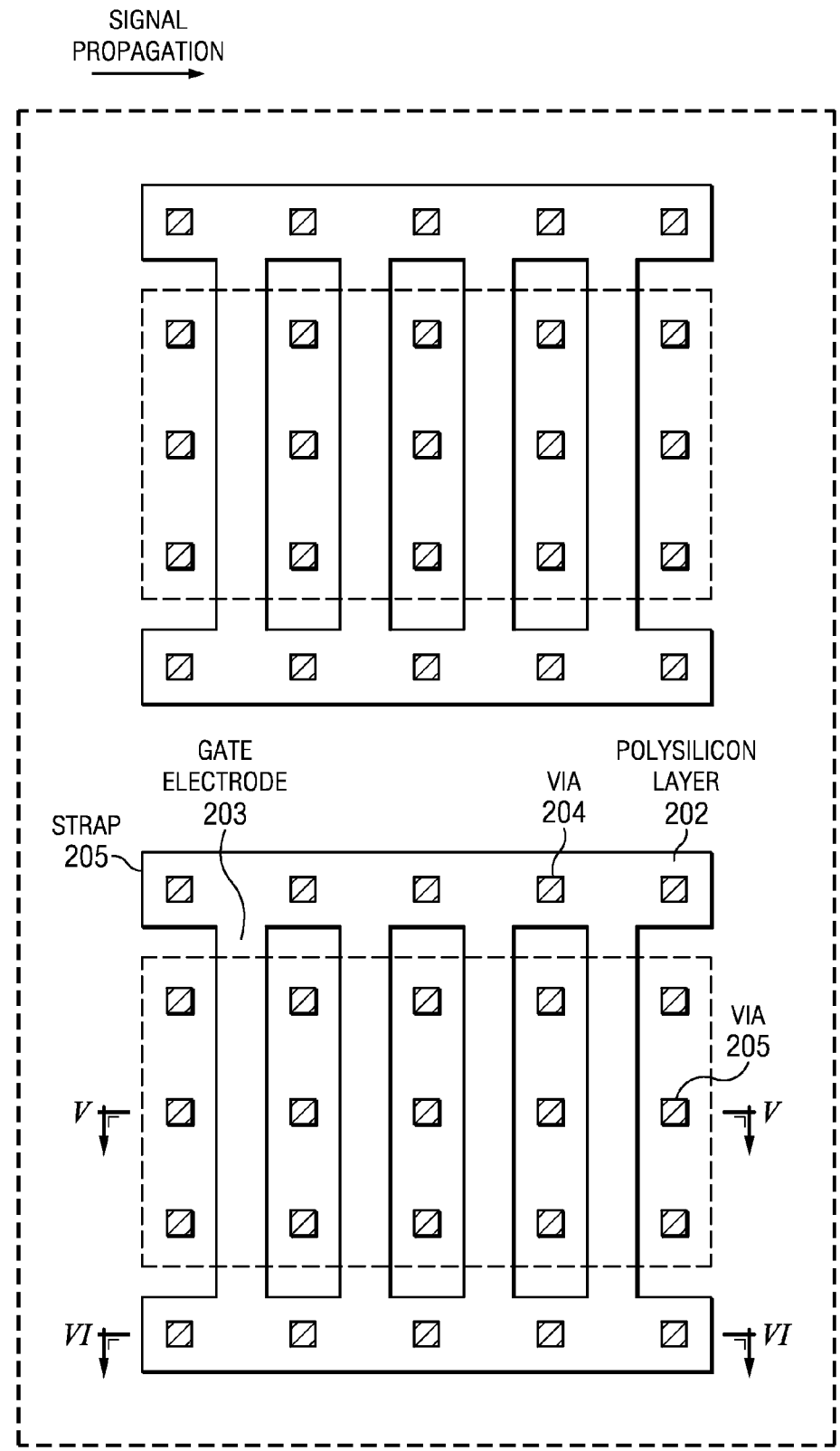
FIGS. 4, 7, and 8 are plan views of the portions of the MOS capacitor of the transmission line units of FIG. 1.
Figure 5:
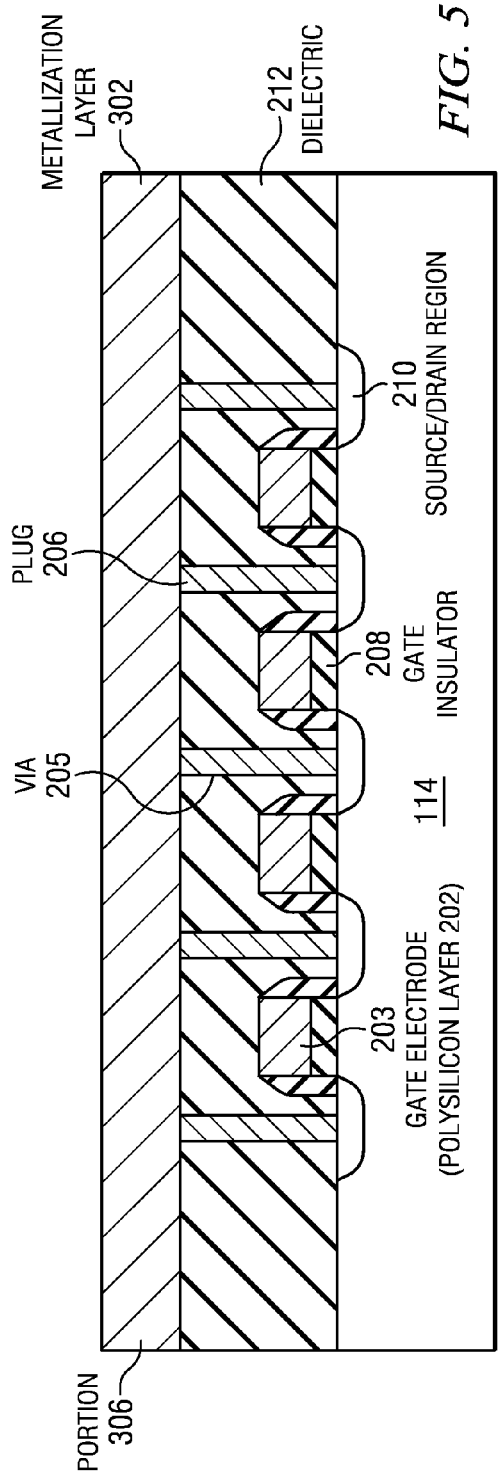
FIG. 5 is a cross-sectional view of the portion of the MOS capacitor of FIG. 4 along section line C-C.
Figure 6:
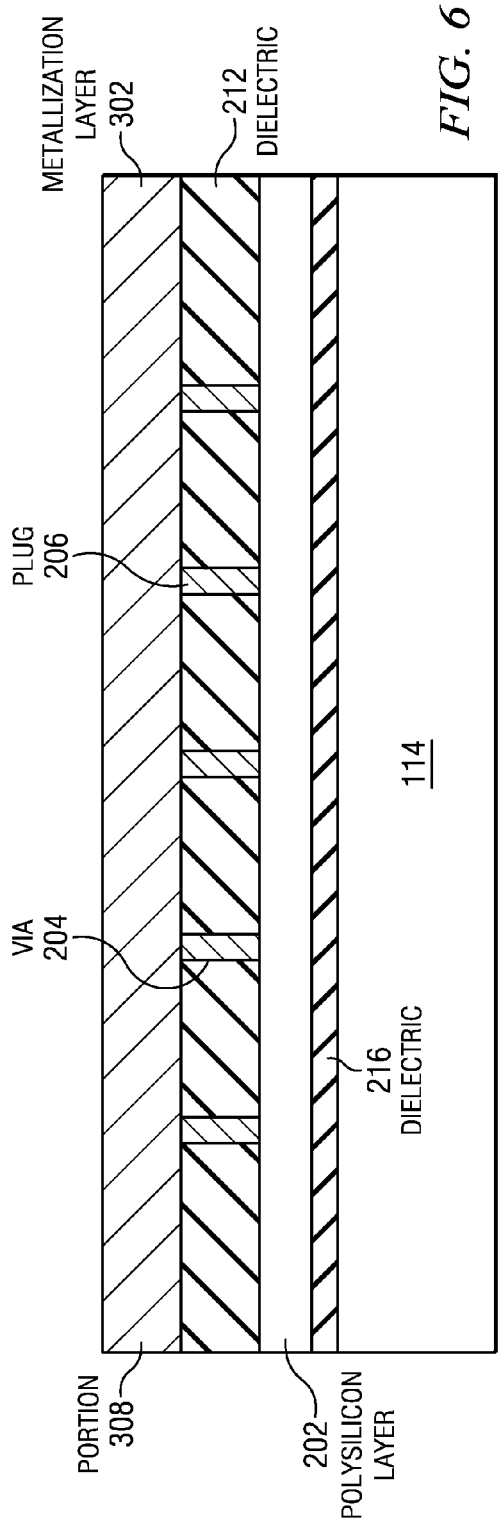
FIG. 6 is a cross-sectional view of the portion of the MOS capacitor of FIG. 4 along section line D-D.

Turning to FIGS. 4 through 6, a MOS capacitor for each transmission line unit 112-1 through 112-9 can be seen. As shown, two separate regions (for example) for portions of this MOS capacitor, and each region can generally employ a number of source/drain regions 210 formed in the substrate 114. For example, there can be five source/drain regions that extend across each region. Between the source/drain regions 210, gate insulators 208 (which can be comprised of silicon dioxide) and gate electrodes 203 (which can be formed of polysilicon) are formed over the substrate 114. The source/drain regions 210 are then coupled to portion 306 of metallization layer 302 with conductive vias 205, which are formed in dielectric 212 (i.e., silicon dioxide) and filled with a plug 206 (i.e., tungsten). This forms one end or electrode of the MOS capacitor. The gate electrodes 203 are coupled to straps 205, which are separated from the substrate 114 by dielectric 206 (i.e., silicon dioxide) and are coupled to portion 308 of metallization layer 302 through conductive vias 204, so as to form the other end or electrode of the MOS capacitor.

Figure 8:
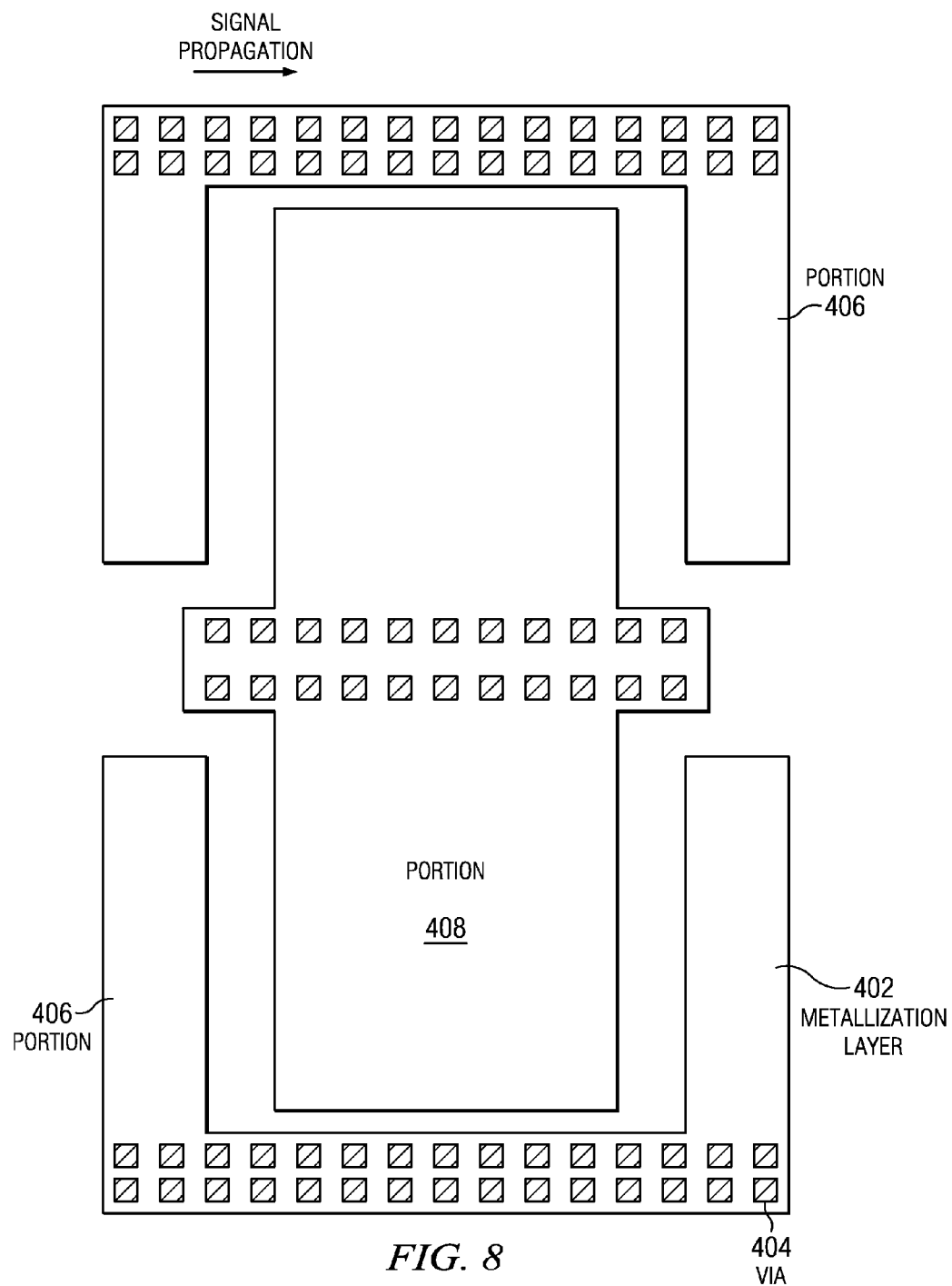

In FIG. 8, a redistribution metallization layer 402 can be seen. This metallization layer 402 can be considered to be a portion of the MOS capacitor because it redistributes the MOS capacitor electrodes. Generally, portion 408 of metallization layer 402 is formed over and coupled to portion 308 of metallization layer 302 through conductive vias 304, and portion 406 of metallization layer 402 is formed over and coupled to portion 306 of metallization layer 302 through conductive vias 304.

Figure 9:
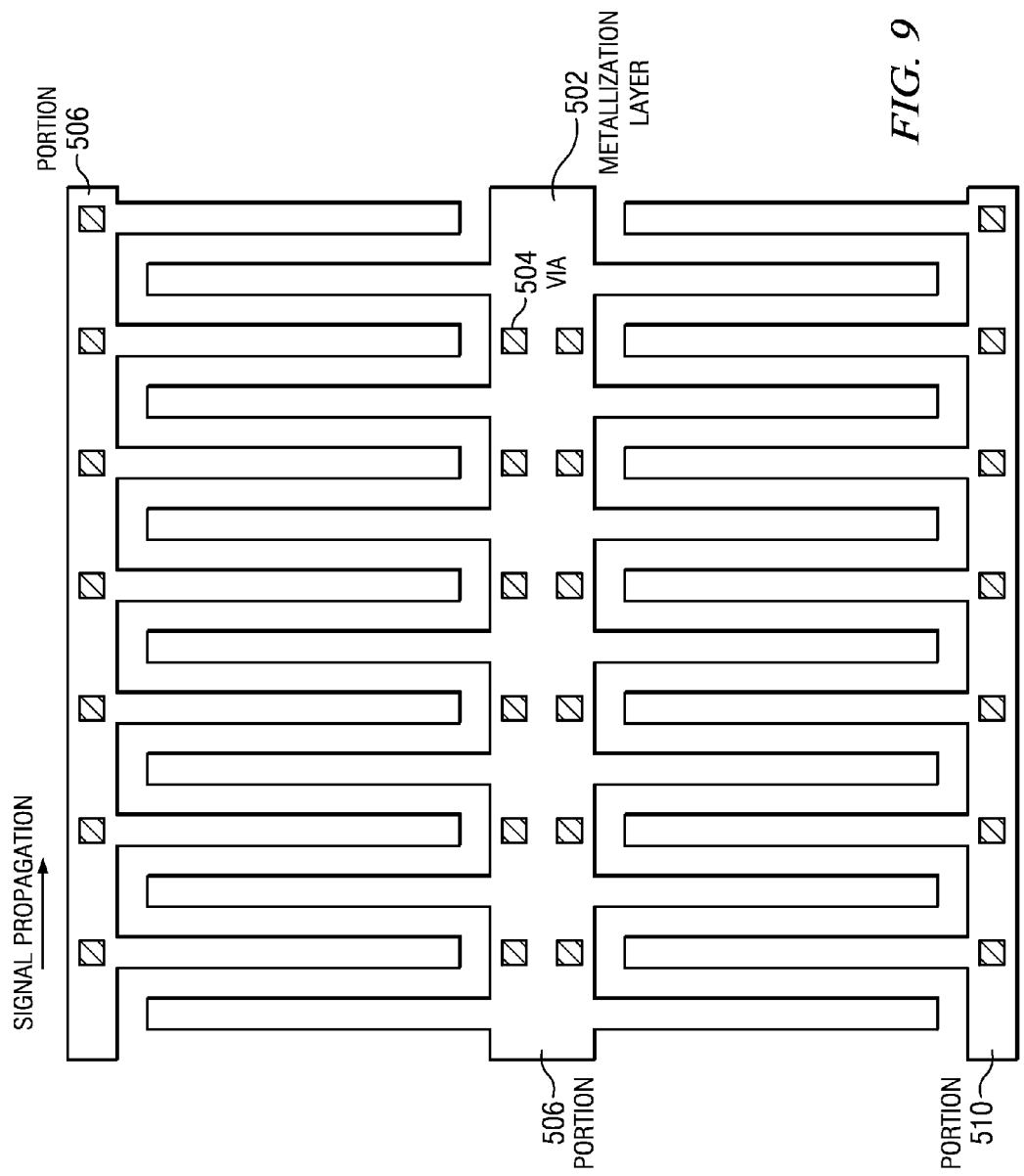
FIGS. 9 through 11 are plan view of portions of the metal capacitor of the transmission line units of FIG. 1.
Figure 10:
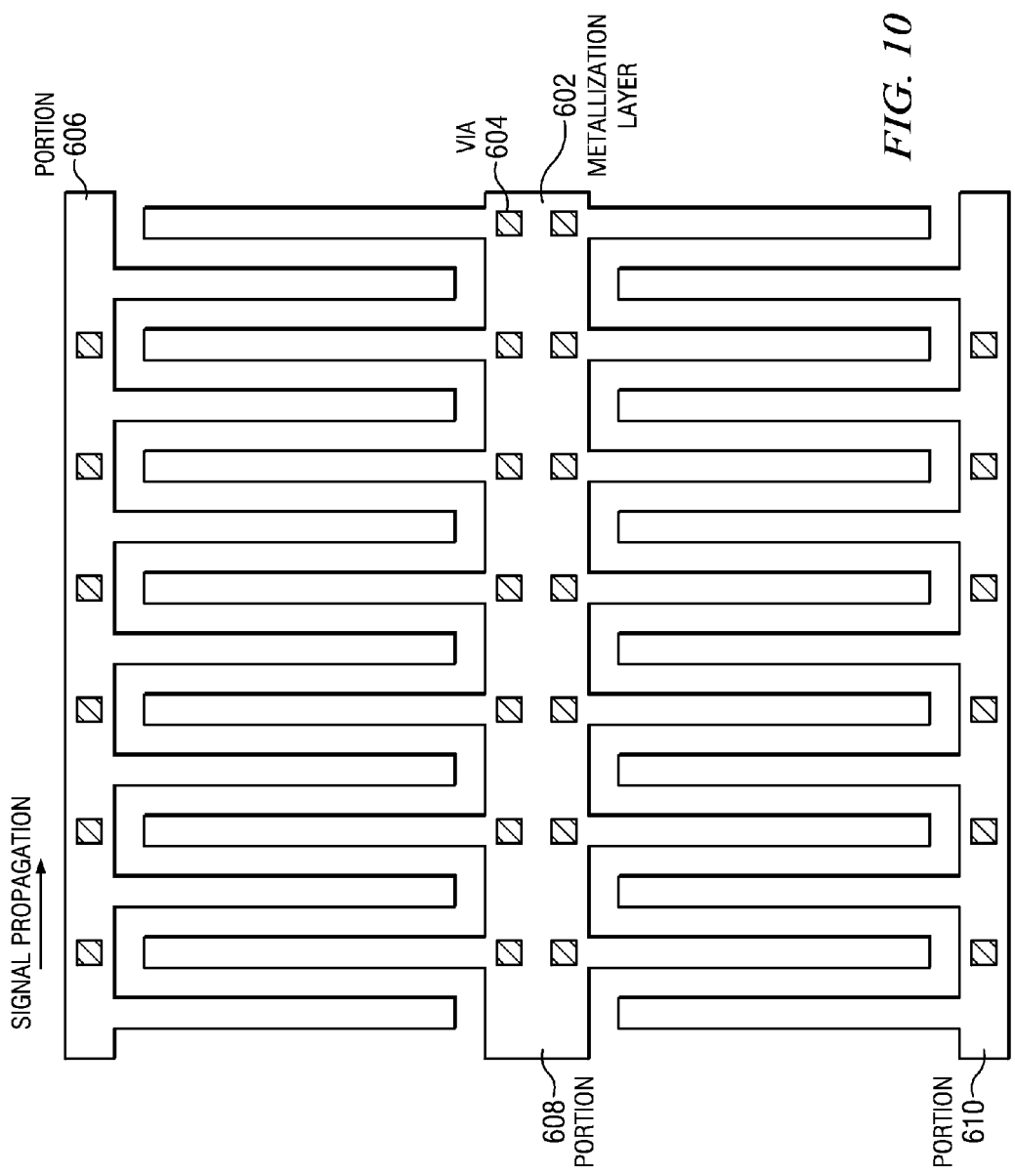
Figure 11:
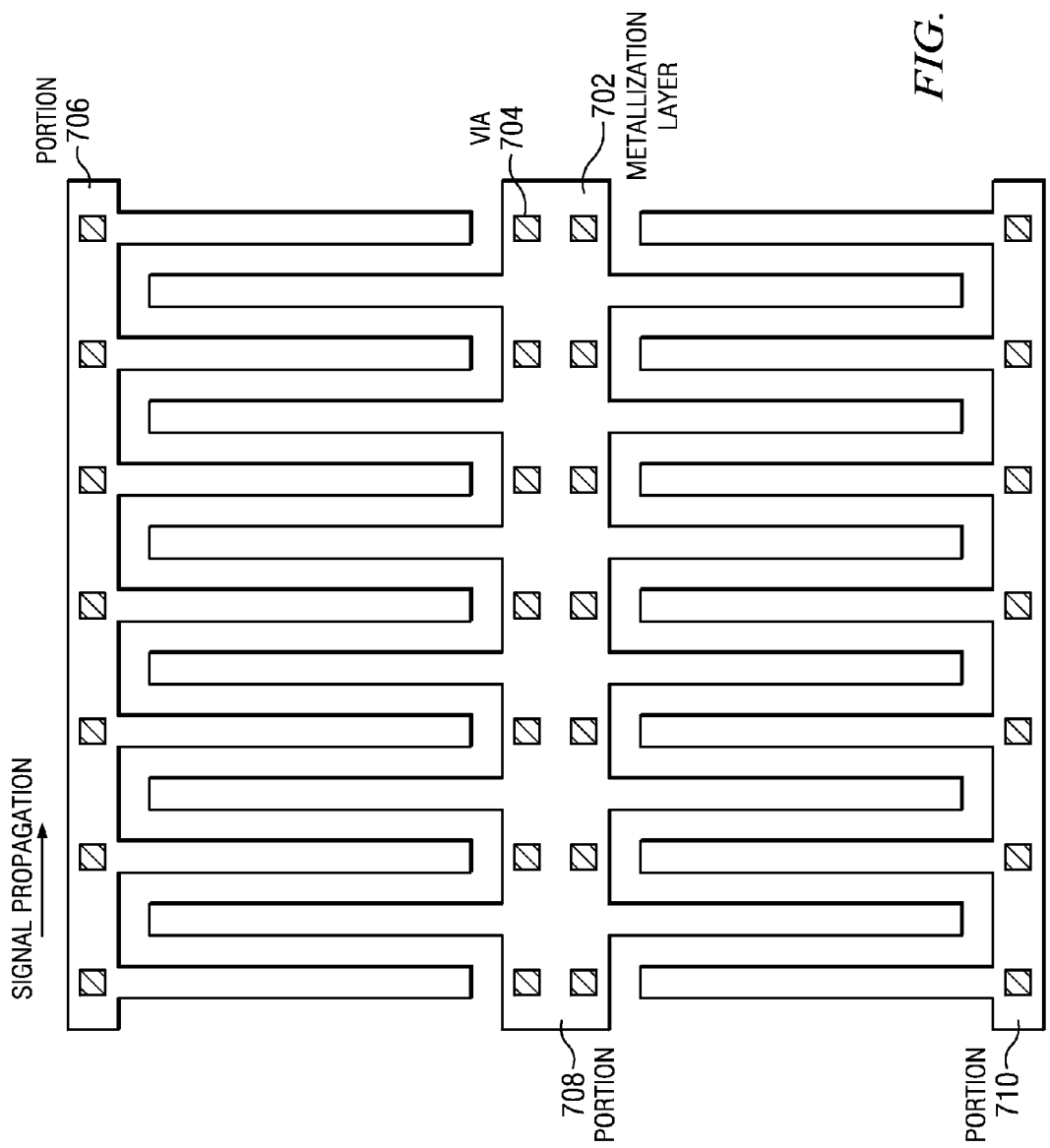

Turning now to FIGS. 9-11, the metal capacitor of each transmission line unit 112-1 to 112-9 can be seen. The metal capacitor is generally comprised of several (for example, three) metal capacitors coupled in parallel with each other. As shown, each metallization layer 502, 602, and 702 forms a separate capacitor and are formed over one another. Namely, each metallization layer 502, 602, and 702 can be formed for three portions 506/508/510, 606/608/610, and 706/708/710 (respectively) that are interdigitated (with a dielectric, such as silicon dioxide therebetween). Portions 506, 510, 606, 610, 706, and 710 are coupled to the source/drains regions 210 through conductive vias 404, 504, and 604, while portions 508, 608, and 708 through conductive vias 404, 504, and 604 are coupled to straps 205.

Figure 12:
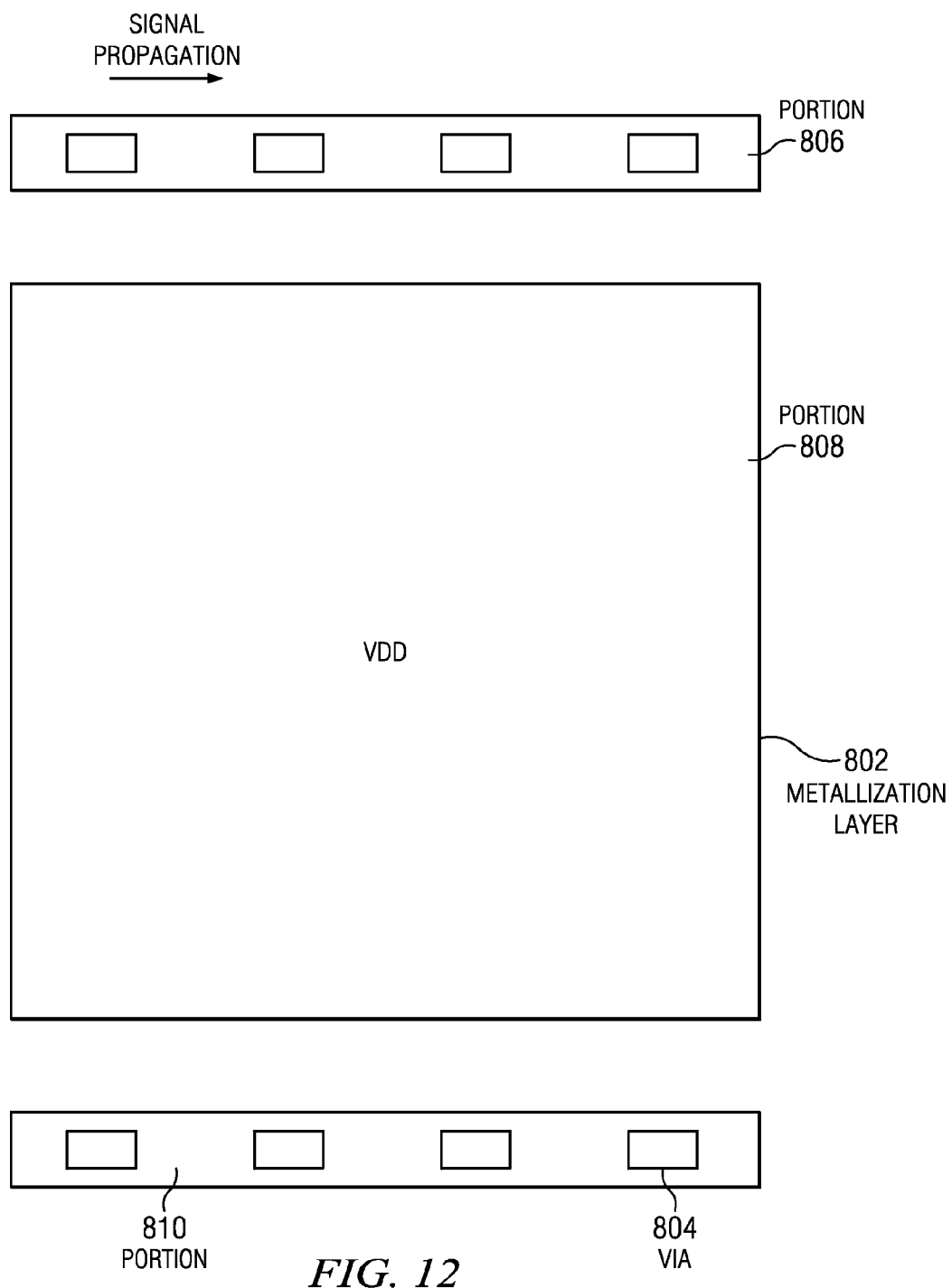
FIGS. 12 and 13 are plan view of portions of the coplanar waveguide of the transmission line units of FIG. 1.
Figure 13:
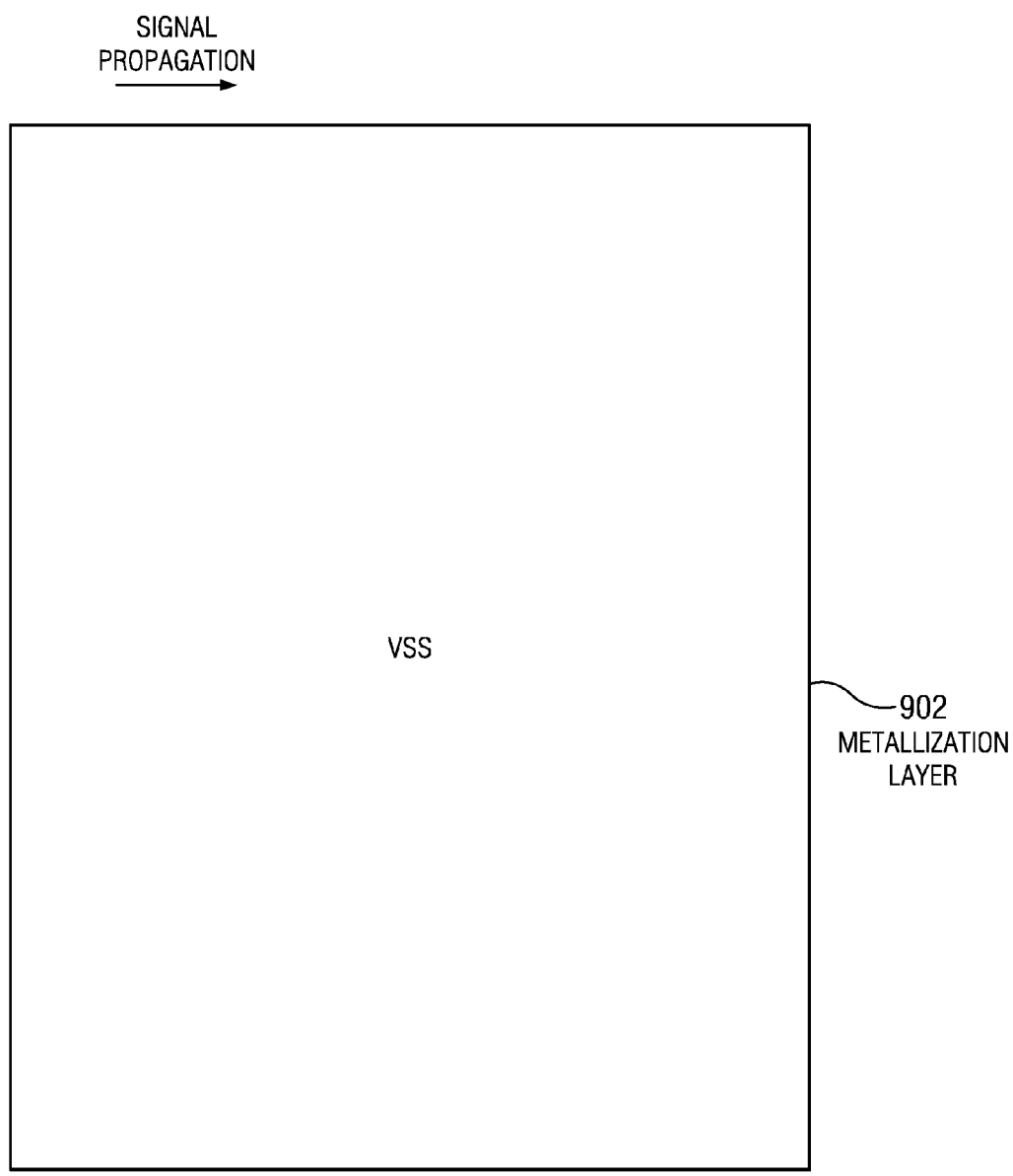

In FIGS. 12 and 13, the coplanar waveguide (which can be coupled to center tap 120) can be seen. Here, metallization layer 802 generally comprises portions 806, 808, and 810, which can be coupled to portions 706, 708, and 710, respectively, through conductive vias 704. Portion 808 receives a supply voltage VDD, which is provided to one "plate" or electrode of each of the capacitors (from the metal capacitor) and the MOS capacitor. Additionally, metallization layer 902 (which is formed over metallization layer 802 and receives a supply voltage VSS, which is typically ground) is coupled to the other "plate" or electrode of each of the capacitors (from the metal capacitor) and the MOS capacitor through conductive vias 804.

Figure 7:
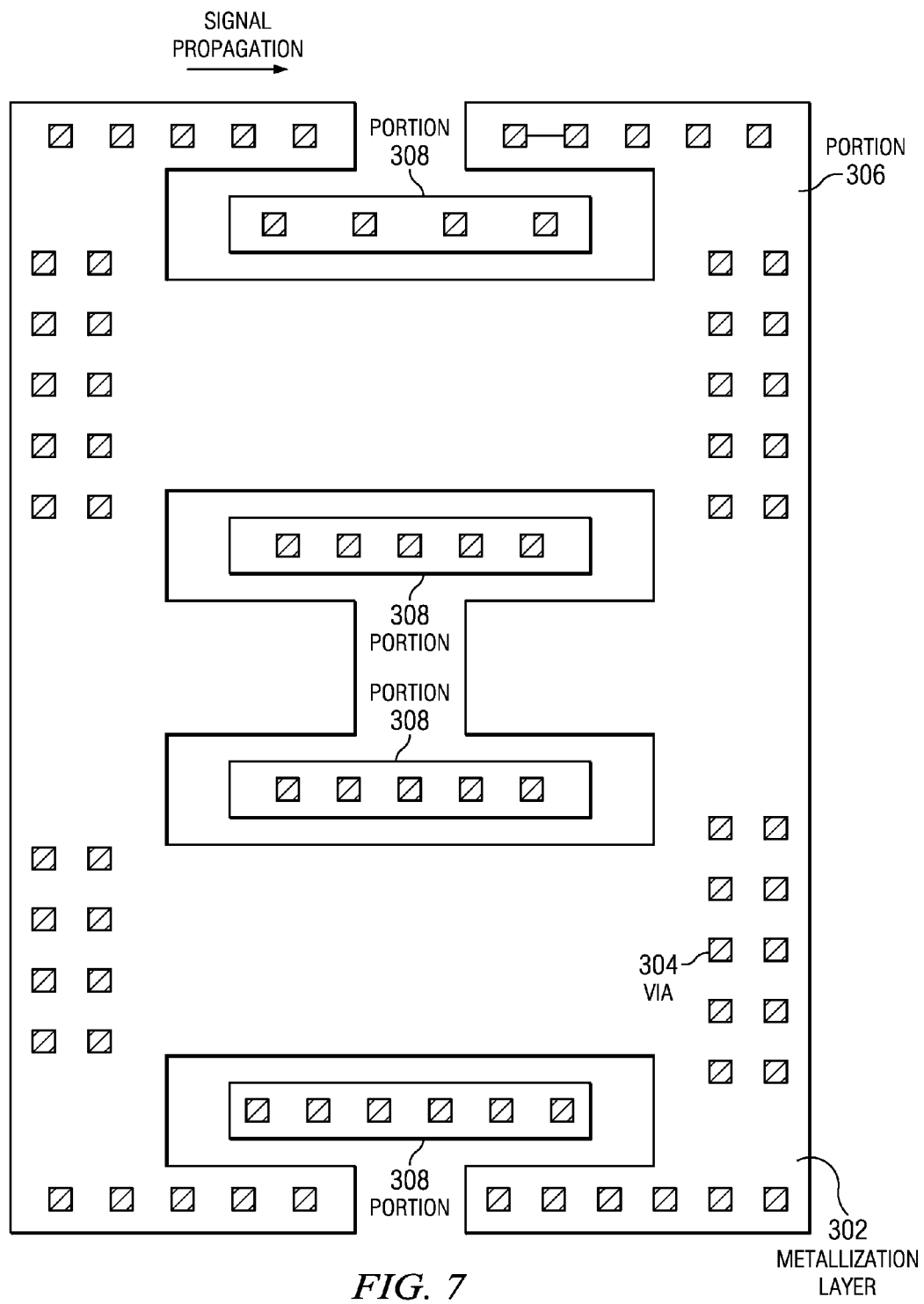
Figure 14:
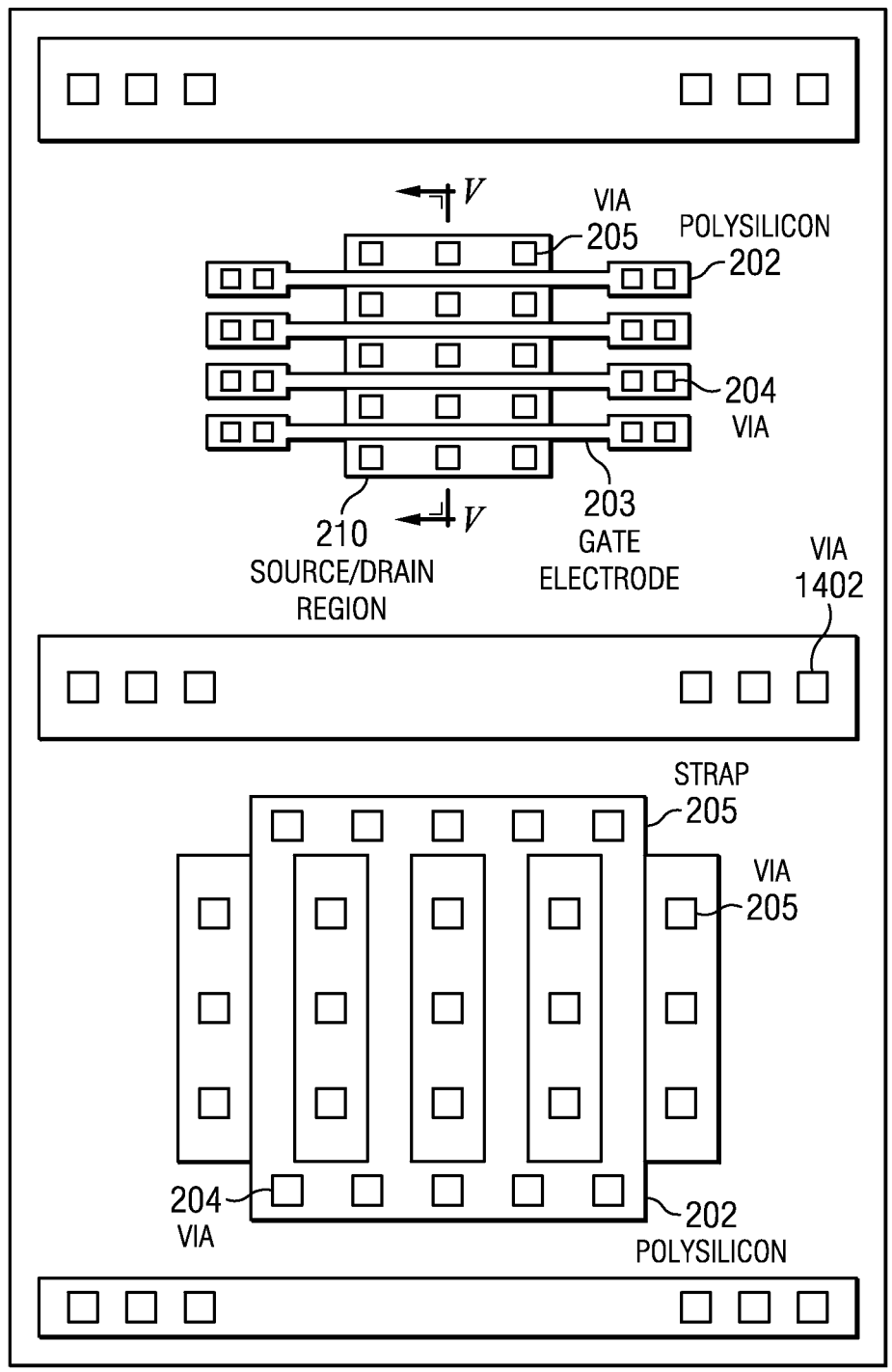
FIGS. 14 through 16 are plan views of the portions of the MOS capacitor/diode of a transmission line unit of FIG. 1.
Figure 15:
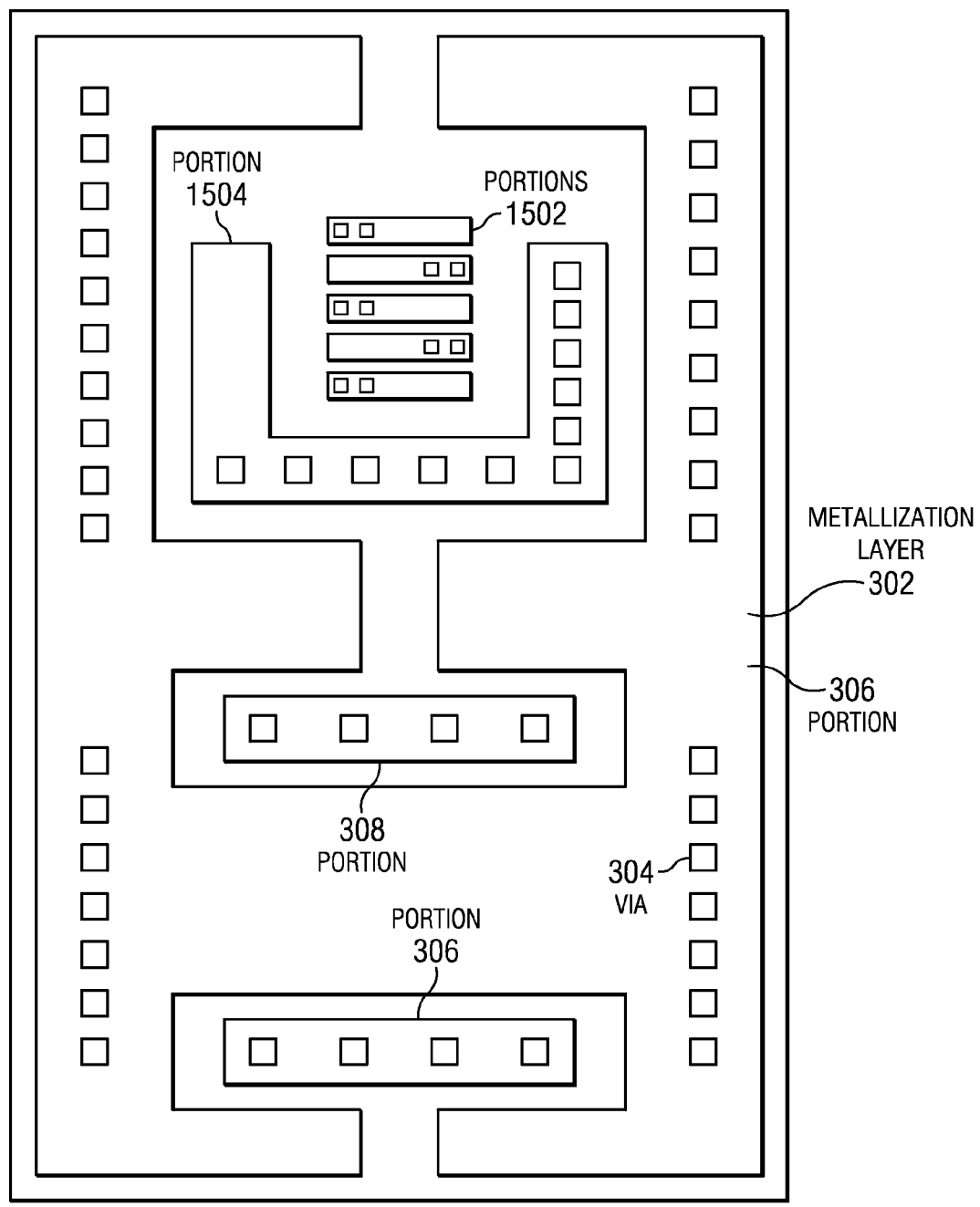
Figure 16:
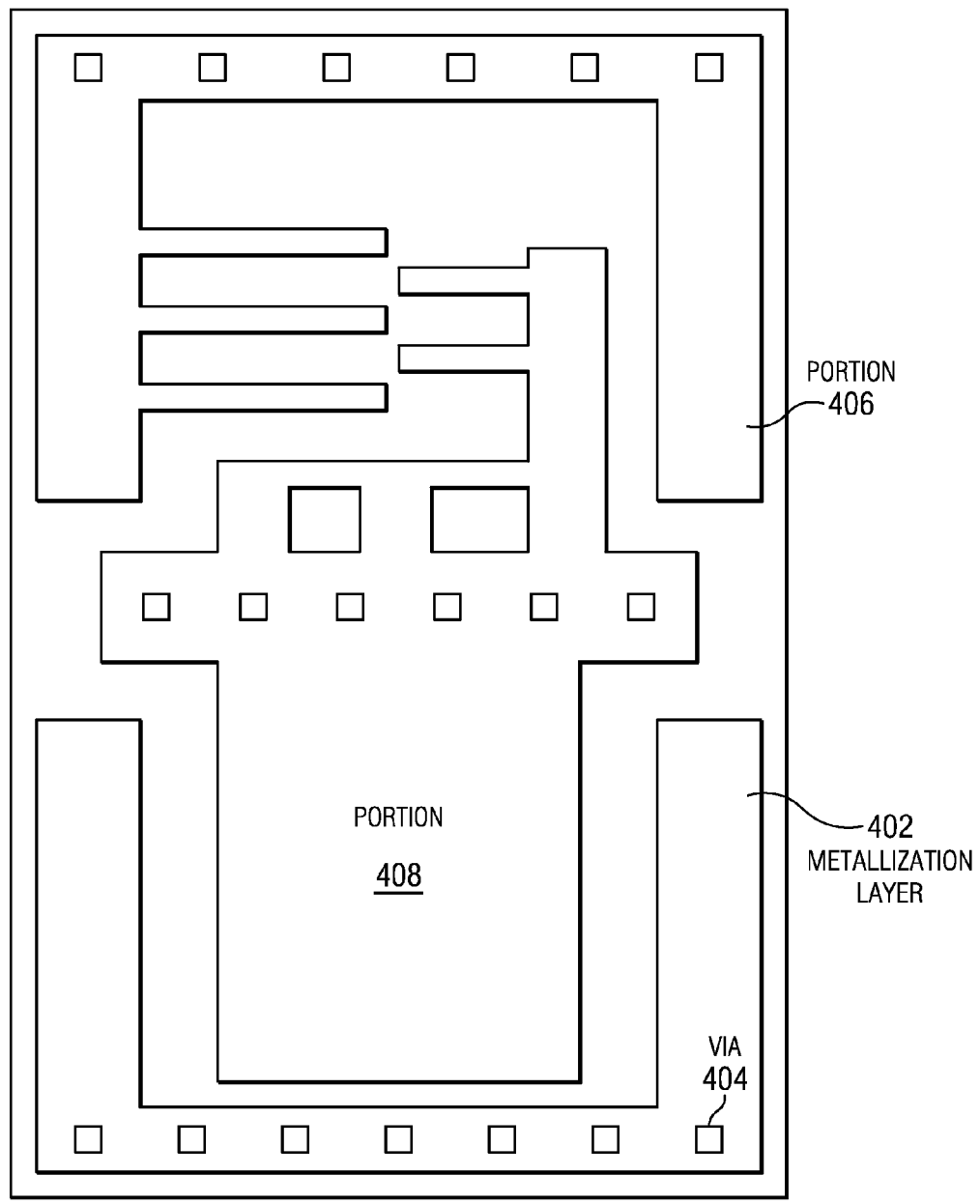

Alternatively, the transmission line unit nearest to the center tap 120 (i.e., transmission line unit 112-1) can be formed of a MOS capacitor/diode, a metal capacitor, and a coplanar waveguide. In FIGS. 14 through 16, the configuration for the MOS capacitor/diode can be seen where the layout of FIGS. 4, 7, and 8 can be replaced by the layouts of FIGS. 14 through 16, respectively. As shown in FIG. 14, a MOS capacitor is formed in the bottom half (similar to FIG. 4), but, in the top half of FIG. 14, the layout is configured for a diode-connected transistor. Additionally, the cross-section along section line E-E of FIG. 14 is similar to the cross-section along section ling C-C, shown in FIG. 5. Also, via 1402 can provide a body connection.

Turning to FIG. 15, metallization layer 302 can be seen for the transmission line unit nearest to the center tap 120 (i.e., transmission line unit 112-1). Here, the top half of FIG. 15 differs from the top half of FIG. 7 in that FIG. 15 includes portions 1502 and 1504. As shown, portions 1502 overlay the source/drain regions 210 and are generally coupled to the source/drain regions 210 by vias 205. Portion 1504 then overlays portions of the polysilicon layer 202 (namely, portions of the polysilicon "fingers" in the top half) and is generally coupled to the polysilicon layer 202 by vias 204 so as to electrically connect the gate electrodes 203 together.

Finally, turning to FIG. 16, metallization layer 402 for transmission line unit 112-1 can be seen. Here, the top half of FIG. 16 differs from top half of FIG. 8 with the configuration of portions 406 and 408. As shown, portion 408 is generally coupled to a some (i.e., two) of the portions 1502 and portion 1504 (meaning that the gate electrodes 203 are, for example, coupled to two of the source/drain regions 210), while portion 406 is coupled to the remaining (i.e., three) portions 1502.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a MOS capacitor formed on a substrate;
   a metal capacitor that is formed over the MOS capacitor; and
   a coplanar waveguide formed over the metal capacitor,
   wherein the metal capacitor further comprises a metallization layer having first, second, and third portions that are interdigitated,
   wherein the metallization layer further comprises a first metallization layer, and wherein the coplanar waveguide further comprises:
      a second metallization layer having first, second, and third portions;
      a first set of conductive vias formed between the first portion of the first metallization layer and the first portion of the second metallization layer;
      a second set of conductive vias formed between the second portion of the first metallization layer and the second portion of the second metallization layer; and
      a third set of conductive vias formed between the third portion of the first metallization layer and the third portion of the second metallization layer.

2. The apparatus of claim 1, wherein the first metallization layer further comprises a plurality of first metallization layers that each have first, second, and third portions.

3. The apparatus of claim 1, wherein the coplanar waveguide further comprises:
   a third metallization layer having a first, second, and third portions; and
   a fourth set of conductive vias formed between at least one of the first and third portions of the second metallization layer and the third metallization layer.

4. The apparatus of claim 3, wherein MOS capacitor further comprises:
   a fourth metallization layer having a first portion and a second portion;
   a plurality of source/drain regions formed in the substrate;

a plurality of gate insulator layers formed over the substrate, wherein each gate insulator layer is formed between at least two source/drain regions;

a plurality of gate electrodes, wherein each gate electrode is formed over at least one of the gate insulator layers;

a strap that is coupled to each gate electrode;

a seventh set of conductive vias, wherein each conductive via from the seventh set is formed between at least one source/drain region and the first portion of the fourth metallization layer; and an eighth set of conductive vias, wherein each conductive via from the eighth set is formed between at the strap and the second portion of the fourth metallization layer.

5. The apparatus of claim 1, wherein the apparatus further comprises a diode formed on the substrate.

6. An apparatus comprising:
a balun having a center tap; and
a plurality of transmission line units that are adjacent to one another to form a transmission line, wherein the transmission line is coupled to the center tap, and wherein the transmission line units near the center tap are dimensioned to have a smaller height than the transmission line units away from center tap, wherein each transmission line unit includes:
a MOS capacitor formed on a substrate;
a metal capacitor that is formed over the MOS capacitor; and
a coplanar waveguide formed over the metal capacitor.

7. The apparatus of claim 6, wherein the metal capacitor further comprises a metallization layer having first, second, and third portions that are interdigitated.

8. The apparatus of claim 7, wherein the metallization layer further comprises a first metallization layer, and wherein the coplanar waveguide further comprises:
a second metallization layer having first, second, and third portions;
a first set of conductive vias formed between the first portion of the first metallization layer and the first portion of the second metallization layer;
a second set of conductive vias formed between the second portion of the first metallization layer and the second portion of the second metallization layer; and
a third set of conductive vias formed between the third portion of the first metallization layer and the third portion of the second metallization layer.

9. The apparatus of claim 8, wherein the first metallization layer further comprises a plurality of first metallization layers that each have first, second, and third portions.

10. The apparatus of claim 9, wherein the coplanar waveguide further comprises:
a third metallization layer having a first, second, and third portions; and
a fourth set of conductive vias formed between at least one of the first and third portions of the second metallization layer and the third metallization layer.

11. The apparatus of claim 10, wherein MOS capacitor further comprises:
a fourth metallization layer having a first portion and a second portion;
a plurality of source/drain regions formed in the substrate;
a plurality of gate insulator layers formed over the substrate, wherein each gate insulator layer is formed between at least two source/drain regions;
a plurality of gate electrodes, wherein each gate electrode is formed over at least one of the gate insulator layers;
a strap that is coupled to each gate electrode;
a seventh set of conductive vias, wherein each conductive via from the seventh set is formed between at least one source/drain region and the first portion of the fourth metallization layer; and
an eighth set of conductive vias, wherein each conductive via from the eighth set is formed between at the strap and the second portion of the fourth metallization layer.

12. The apparatus of claim 11, wherein each transmission line unit is about 4 µm in width, and wherein each transmission line units that is located away from the center tap are about 9.5 µm or greater in height, and wherein each transmission line units that is located near the center tap are less than about 9.5 µm in height.

13. The apparatus of claim 6, wherein the transmission line unit nearest to the center tap further comprises a diode formed on the substrate.

14. An apparatus comprising:
a balun having a center tap; and
a plurality of transmission line units that are adjacent to one another to form a transmission line, wherein the transmission line is coupled to the center tap, and wherein the transmission line units near the center tap are dimensioned to have a smaller height than the transmission line units away from center tap, wherein each transmission line unit includes:
a MOS capacitor having:
a plurality of source/drain regions formed in the substrate;
a plurality of gate insulator layers formed over the substrate, wherein each gate insulator layer is formed between at least two source/drain regions;
a plurality of gate electrodes, wherein each gate electrode is formed over at least one of the gate insulator layers;
a strap that is coupled to each gate electrode;
a first metallization layer having a first portion and a second portion;
a first set of conductive vias, wherein each conductive via from the first set is formed between at least one source/drain region and the first portion of the first metallization layer; and
a second set of conductive vias, wherein each conductive via from the second set is formed between at the strap and the second portion of the first metallization layer;
a second metallization layer having a first portion and a second portion;
a third set of conductive vias, wherein each conductive via from the third set is formed between the first portion of the first metallization layer and the first portion of the second metallization layer;
a fourth set of conductive vias, wherein each conductive via from the fourth set is formed between at the second portion of the first metallization layer and the second portion of the second metallization layer;
a metal capacitor having:
a third metallization layer having first, second, and third portions that are interdigitated;
a fifth set of conductive vias, wherein each conductive via from the fifth set is formed between the first portion of the second metallization layer and at least one of the first and third portions of the third metallization layer; and
a sixth set of conductive vias, wherein each conductive via from the sixth set is formed between at the second portion of the third metallization layer and the second portion of the second metallization layer;

a fourth metallization layer having a first, second, and third portions that are interdigitated;
a seventh set of conductive vias formed between the first portion of the fourth metallization layer and the first portion of the third metallization layer;
an eighth set of conductive vias formed between the second portion of the fourth metallization layer and the second portion of the third metallization layer;
a ninth set of conductive vias formed between the third portion of the fourth metallization layer and the third portion of the third metallization layer;
a fifth metallization layer having a first, second, and third portions that are interdigitated;
a tenth set of conductive vias formed between the first portion of the fourth metallization layer and the first portion of the fifth metallization layer;
an eleventh set of conductive vias formed between the second portion of the fourth metallization layer and the second portion of the fifth metallization layer; and
a twelfth set of conductive vias formed between the third portion of the fourth metallization layer and the third portion of the fifth metallization layer; and
a coplanar waveguide having:
a sixth metallization layer having a first, second, and third portions, wherein the second portion of the sixth metallization layer receives a first supply voltage;
a thirteenth set of conductive vias formed between the first portion of the fifth metallization layer and the first portion of the sixth metallization layer;
a fourteenth set of conductive vias formed between the second portion of the fifth metallization layer and the second portion of the sixth metallization layer;
a fifteenth set of conductive vias formed between the third portion of the fifth metallization layer and the third portion of the sixth metallization layer;
a seventh metallization layer that receives a second supply voltage; and
a sixteenth set of conductive vias coupled between at least one of the first and third portions of the sixth metallization layer and the seventh metallization layer.

15. The apparatus of claim 14, wherein the strap and the gate electrodes are formed of polysilicon.

16. The apparatus of claim 15, wherein the first, second, third, fourth, fifth, sixth, and seventh metallization layers are formed of copper or aluminum.

17. The apparatus of claim 16, wherein the second supply voltage is ground.

18. The apparatus of claim 17, wherein each transmission line unit is about 4 μm in width, and wherein each transmission line units that is located away from the center tap are about 9.5 μm or greater in height, and wherein each transmission line units that is located near the center tap are less than about 9.5 μm in height.

* * * * *